(12) United States Patent
Ho

(10) Patent No.: US 7,571,202 B2
(45) Date of Patent: Aug. 4, 2009

(54) METHOD AND APPARATUS FOR DIGITAL NOISE MASK FILTERING

(75) Inventor: Daniel Ho, Palo Alto, CA (US)

(73) Assignee: VIA Technologies, Inc., Taipei (TW)

( * ) Notice: Subject to any disclaimer, the term of this patent is extended or adjusted under 35 U.S.C. 154(b) by 876 days.

(21) Appl. No.: 11/221,582

(22) Filed: Sep. 7, 2005

(65) Prior Publication Data

US 2007/0055719 A1    Mar. 8, 2007

(51) Int. Cl.
*G06F 17/10* (2006.01)
*H03B 1/00* (2006.01)

(52) U.S. Cl. ........................ 708/300; 327/551

(58) Field of Classification Search ................. 708/300; 327/551
See application file for complete search history.

(56) References Cited

U.S. PATENT DOCUMENTS 5,113,098 A * 5/1992 Teymouri ................... 327/552
5,917,340 A 6/1999 Manohar et al.
6,037,827 A 3/2000 Fisch
6,389,086 B1 * 5/2002 Le et al. ...................... 375/350
6,433,600 B2 8/2002 Ilkbahar
6,535,057 B2 * 3/2003 Chakravarthy ............... 327/551
6,628,219 B2 9/2003 Dedic
6,841,983 B2 1/2005 Thomas

* cited by examiner

*Primary Examiner*—Chuong D Ngo
(74) *Attorney, Agent, or Firm*—James W. Huffman

(57) ABSTRACT

A system and method for filtering spurious transitions from a digital signal is disclosed. The system includes a latch, a timer, and a logic circuit. Upon a transition of the digital signal, the latch holds the digital signal to block any additional transitions and the timer, which is connected to the output of the latch, begins a timing operation that creates a filter pulse. The output of the timer is then combined with the digital signal to filter the spurious transitions that may occur after the transition of the signal. The timer is implemented as an integrator that generates a ramp signal using a stable current source and a comparator that trips when the ramp signal passes a threshold. Use of the integrator and comparator saves space and reduces the system's operating current compared to the conventional approach.

7 Claims, 7 Drawing Sheets

FIG. 1
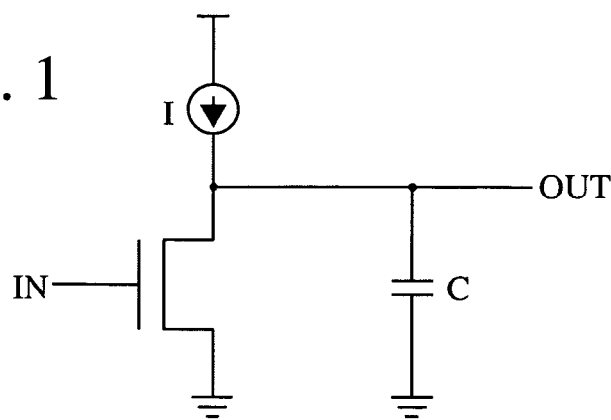
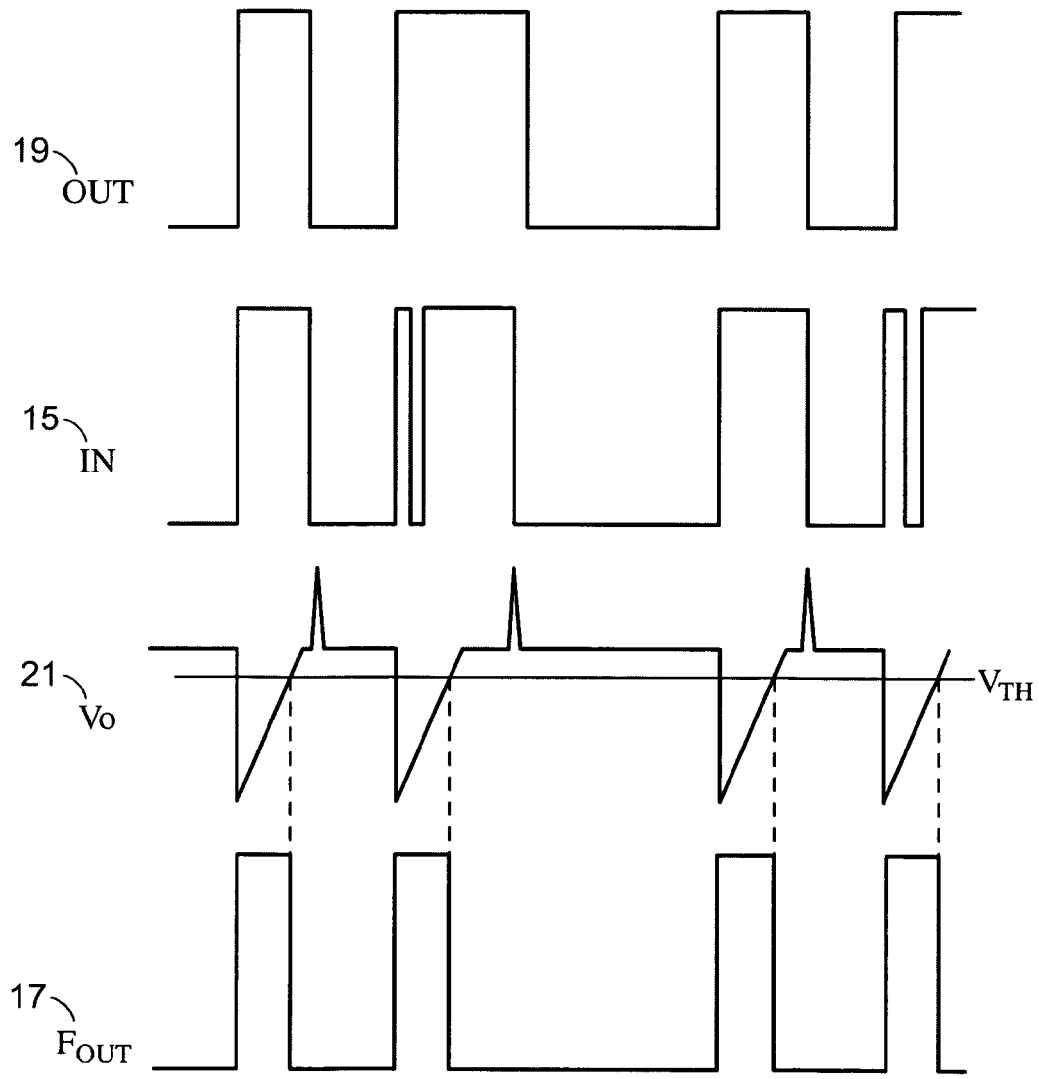
FIG. 2C

METHOD AND APPARATUS FOR DIGITAL NOISE MASK FILTERING

FIELD OF THE INVENTION

The present invention relates generally to noise filtering circuitry and more specifically to removal of noise in a digital circuit.

DESCRIPTION OF THE RELATED ART

In many mixed-modes, analog and digital, systems, for example in a switching voltage regulator, there often is full logic-level digital switching noise or 'glitches' due to substrate noise or switching noise. This unwanted digital noise is almost certain to cause erroneous system operation. FIG. 2A shows the input and output waveforms illustrating the problem. In the prior art, shown in FIG. 1, a switch, a large capacitor, and a current source providing a weak pull up are used to achieve this purpose. The disadvantages of the prior art are that it is difficult to control exactly how long to ignore the digital noise or glitches and there is no latch or flip-flop within this circuit that acts as a memory device to suppress multiple glitches that might occur.

BRIEF SUMMARY OF THE INVENTION

This invention describes a circuit and method that can mask out or ignore the digital noise or glitches for a certain time duration during which the circuit becomes fully settled. After this mask-out time, the circuit output is allowed to follow the input. An important characteristic of the present invention is the use of an integrator and comparator to create a pre-defined duration pulse and an OR-gate to mask out the digital noise.

One embodiment of the present invention is a system for filtering spurious transitions from a digital signal. The system includes a D-latch, a timer and a logic circuit. The latch is operative to follow on its output the digital signal in a follow mode and to hold the digital signal in the hold mode, the follow mode being responsive to a filter signal in a first state and the hold mode being responsive to the filter signal in a second state. The timer is connected to the output of the latch, and is operative to set, upon a transition of the digital signal at the latch output, the filter signal in the second state and to set the filter signal in the first state when the timer expire. The logic circuit combines the digital signal with the filter signal to generate the filtered digital signal, by which the spurious logic transitions of the digital signal are blocked when the filter signal is in the second state.

Another embodiment of the present invention is a method for filtering spurious logic transitions from a digital signal. The method includes (i) generating a filter signal, the filter signal having a first state and a second state, the second state of the filter signal being present for a prescribed period of time following a transition of the digital signal, and (ii) combining the digital signal with the filter signal to generate the filtered signal, wherein the spurious logic transitions of the digital signal are blocked when the filter signal is in the second state.

One advantage of the present invention is that the integrator and comparator are based on a current source and a capacitor which saves area compared to the RC time constant approach to generate a small timing pulse.

Another advantage is that a memory device is used to suppress multiple glitches.

Yet another advantage is that the circuitry for the present invention can use less area than an RC one-shot approach in order to generate a small timing pulse.

Yet another advantage is that the minimum current in circuit can be as low as 20-50 nA (should be a couple orders of magnitude larger than junction leakages of transistors connected to this node). These leakages grow very rapidly above 110-120° C., so for IC operating at 140-150° C., the minimum current may be increased to 200-500 nA.

BRIEF DESCRIPTION OF THE DRAWINGS

These and other features, aspects and advantages of the present invention will become better understood with regard to the following description, appended claims, and accompanying drawings where:

FIG. 1 shows a circuit illustrative of the prior art;

FIG. 2C shows waveforms at key points in the block diagram;

DETAILED DESCRIPTION OF THE INVENTION

Figure 2A:
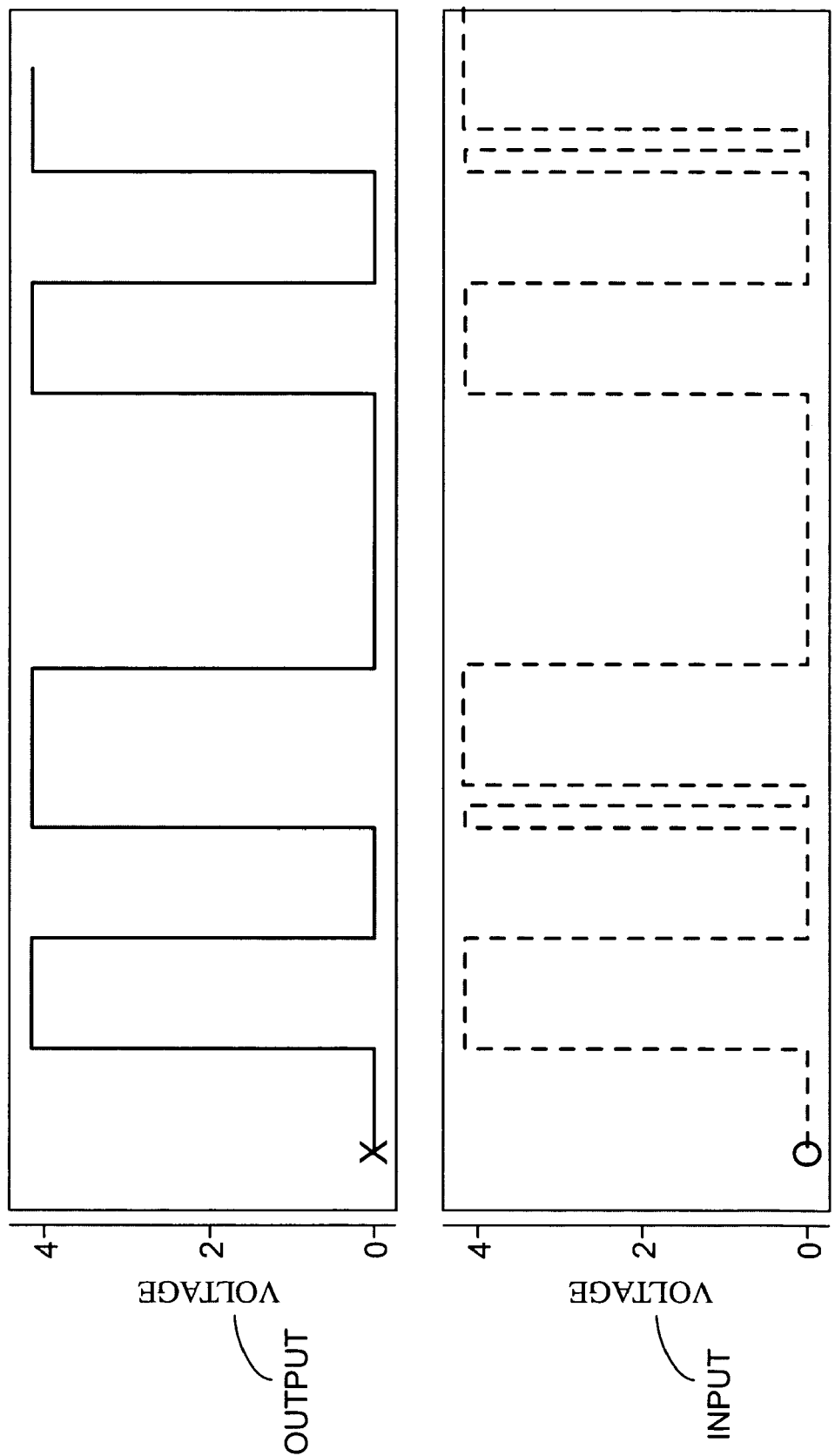
FIG. 2A shows the desired input and output waveforms of the present invention.

FIG. 2A shows input and desired output waveforms of the present invention. The input waveform IN shows a glitch or very short pulse that occurs after the rising transition of the input signal. Multiple short pulses can be present. The desired output OUT of the circuit is shown in the output waveform. The output signal OUT should transition to a logic high at the first transition of the input and stay high until the input signal transitions low, thereby ignoring any transitions after the initial high-going transition.

Figure 2B:
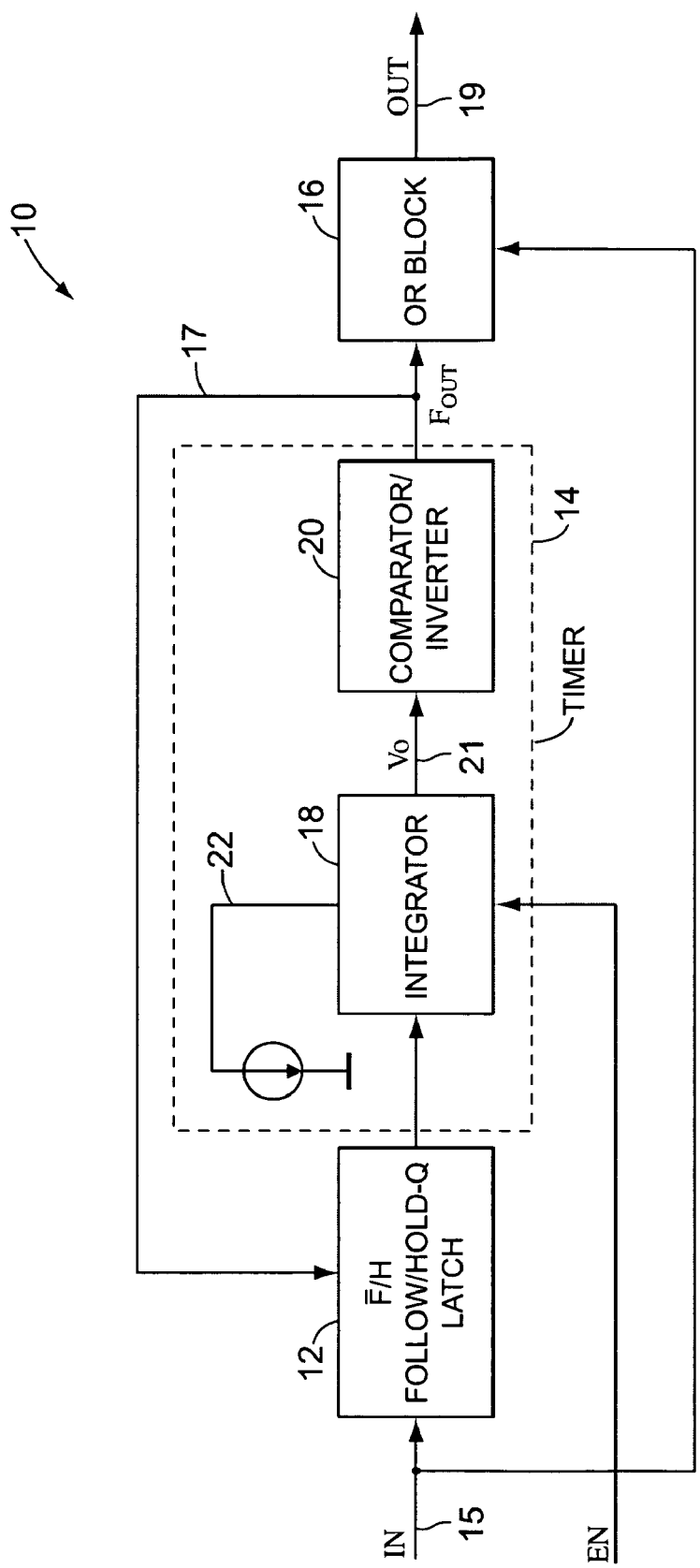
FIG. 2B shows a block diagram of the present invention.

FIG. 2B shows a block diagram 10 of the present invention, which includes a follow/hold latch 12, a timer block 14, and a signal combining block (OR-block) 16. The follow/hold latch 12 is operative to follow the input signal IN 15 when a filter signal, Fout 17, is low and to hold the output when the filter signal is high. The timer block 14 creates the filter signal, Fout 17, which is fed back to control the follow/hold latch 12. The OR-block 16 combines the input signal IN 15 with the filter signal Fout 17 signal to produce the filtered output signal OUT 19. The timer block 14 includes an integrator block 18 and a comparator/inverter block 20. The integrator block 18 generates a ramp signal Vo 21 that depends on current source 22 and the comparator/inverter block 20 compares the ramp signal Vo 21 to a threshold voltage to define the duration of the filter signal Fout 17.

FIG. 2C shows waveforms at key points in the block diagram. Referring to FIGS. 2B and 2C, overall operation is as follows. When the input signal IN 15 is low and the follow/hold latch 12 is in follow mode, the output $\overline{Q}$ of the follow/hold latch 12 is high (the latch 12 has a net inversion between the input and output) and the Vo signal 21 is also high, causing the filter signal Fout 17 to be low, which confirms that the latch 12 is in the follow mode and responsive to the input signal IN 15. When the input signal IN 15 transitions high, the follow/hold latch 12 output $\overline{Q}$ transitions low, causing the integrator 18 to begin generating an upward ramp on Vo 21 and the comparator/inverter 20 to generate a high on Fout 17, holding the output of the follow/hold latch 12. After a short time, which depends on the size of the current source 22 and the comparator threshold $V_{TH}$, the ramp on Vo 21 crosses the threshold of the comparator/inverter 20 and its output, Fout 17, now transitions low, placing the follow/hold latch 12 in the follow state, making it again responsive to the input signal IN 15. When the input signal IN 15 transitions back to a low state, the follow/hold latch 12 switches to a high state, but no logic change occurs on the Vo signal 21 and the follow/hold latch 12 stays in the follow mode. In this manner, the circuit provides on the Fout signal 17 a pulse, whose duration is related to the ramp rate and the threshold of the comparator/inverter 20. This pulse is used to maintain the output of the OR-block 16 at a high state, regardless of any spurious transitions of the input signal IN 15 that might occur during the pulse.

Figure 3:
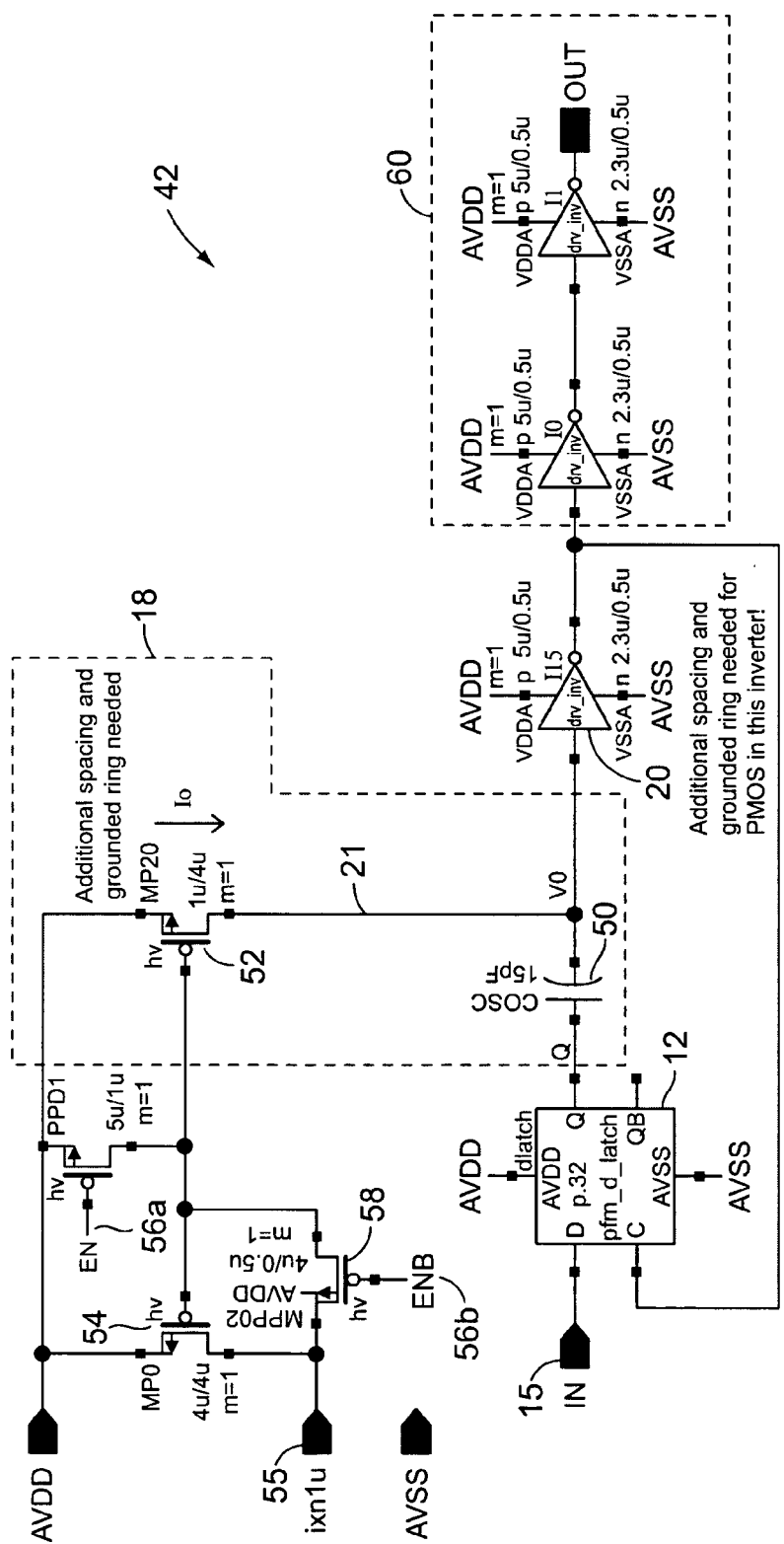
FIG. 3 shows a circuit embodiment of the follow/hold, integrator, and comparator blocks in the diagram of FIG. 1B.

FIG. 3 shows a circuit embodiment of the follow/hold latch 12, integrator 18, and comparator blocks 20 in FIG. 2B.

Figure 4:
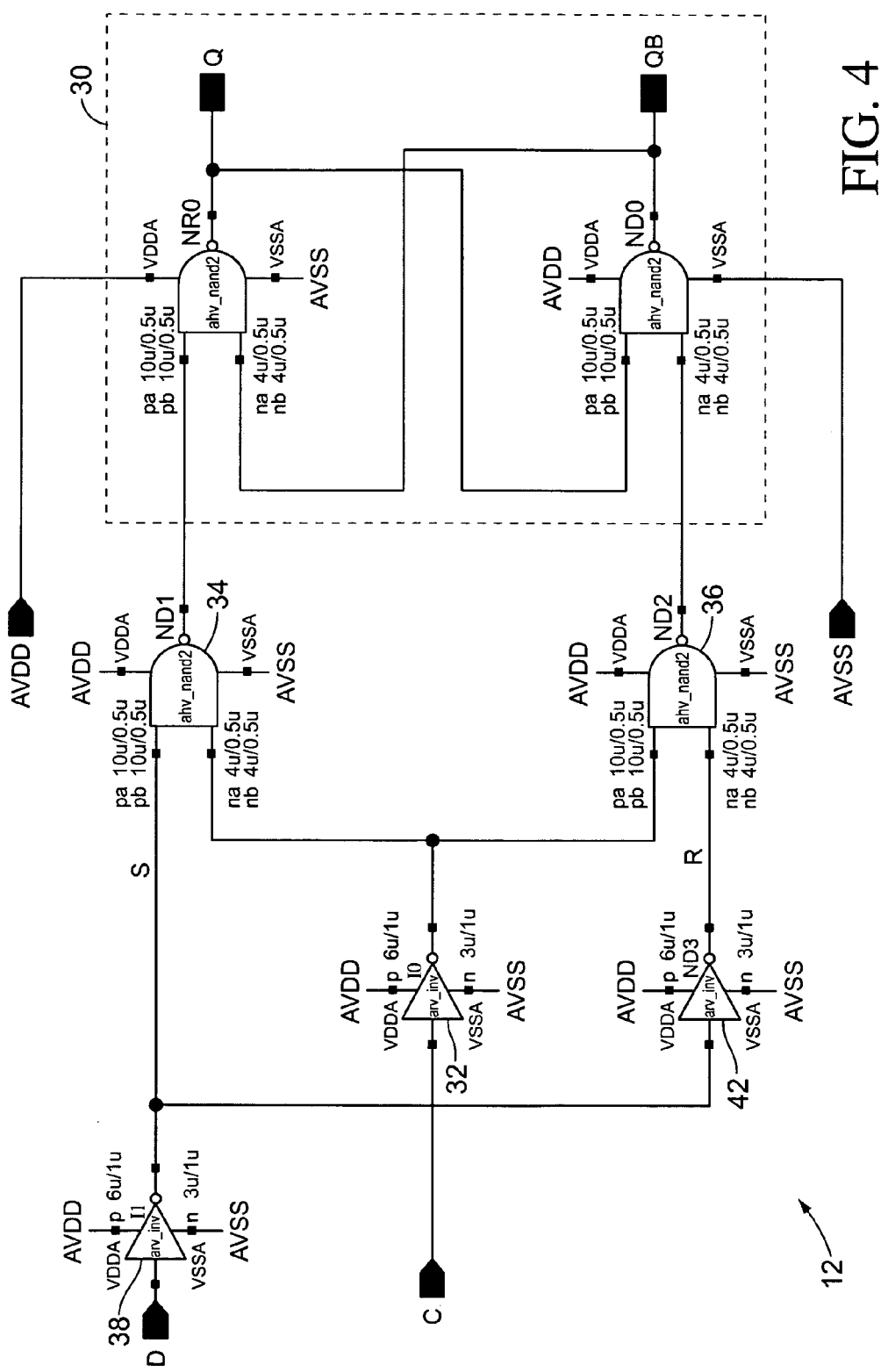
FIG. 4 shows the follow/hold D-latch circuit for use in the present invention.

The follow/hold latch 12 is implemented as shown in FIG. 4. The follow/hold latch 12 has C and D inputs Q and QB outputs, which are the outputs of a standard cross-coupled NAND structure 30. Input C is coupled via an inverter 32 to first and second NAND gates 34, 36 to enable the entry of data D via inverters 38 and 40 into the cross-coupled structure 30. AVDD and AVSS are the supply and ground connections respectively for the circuitry. The Q output follows the D input with an inversion, when the C input is low and retains its state when the C input is high.

Referring to the circuitry 42 of FIG. 3, the integrator 18 is implemented by means of a capacitor C 50 connected in series between the output of the follow/hold block 12 and the comparator/inverter 20 and a current source is provided by transistor MP20 52 to the capacitor C 50. Transistor MP0 54 forms a current mirror with transistor MP20 52 to set the current in transistor MP20 52. The MP20 52 transistor preferably has additional spacing and a ground ring. The current mirror MP0 54 and MP20 52 reflects the current established by a reference current source, ixn1$u$ 55. The rate of the ramp $\Delta V/\Delta T$ generated on Vo 21 by the integrator is Io/C, where Io is the mirrored current. The current can be imprecise due to current source mismatch, but a cascode current source can be used instead. The current mirror MP0 54 and MP20 52 has an enable input EN 56$a,b$ that allows it to be shut off to save power. When the enable input EN 56$a$ is low (ENB 56$b$ provided by inverter 62 is high), the gates of the MP0 54 and MP20 52 transistors are pulled to the supply voltage shutting them off. When the EN 56$a$ input is high, the gates of the MP0 54 and MP20 52 transistors are pulled to a low voltage via the MPP02 58 transistor, allowing them to turn on.

The comparator 20 is implemented as a standard CMOS inverter, but other implementations are possible. Preferably, the inverter 20 has additional spacing and a ground ring for the PMOS portion of the inverter. The pulse produced by the action of the integrator 18 and the comparator 20, buffered by block 60, has a duration of $\Delta T = V_{th} (C/I_o)$. In practice, the delay should last until all of the switching noise on the input IN is completed, usually about 30-50 nS. If the pulse is 50 ns, the threshold is 1 volt and the capacitance is 15 pF, the mirror current is about 0.30 mA.

Figure 5:
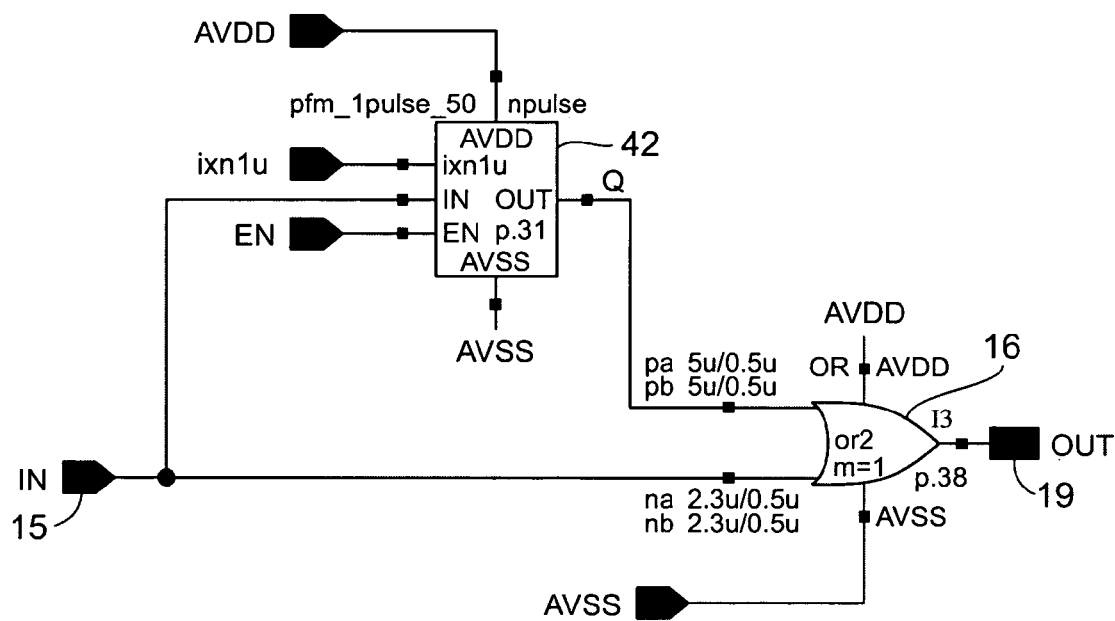
FIG. 5 shows the connection of the blocks of FIG. 2 with the final OR-block.

FIG. 5 shows the connection of the blocks of FIG. 3 with the final OR-block 16. The output of the comparator/inverter is buffered by block 60 (in FIG. 3) and then combined (OR'ed) in gate 16 with the IN signal, to mask any multiple transitions that might occur after the rising transition, thus rendering the OUT signal 19 clean.

Figure 6:
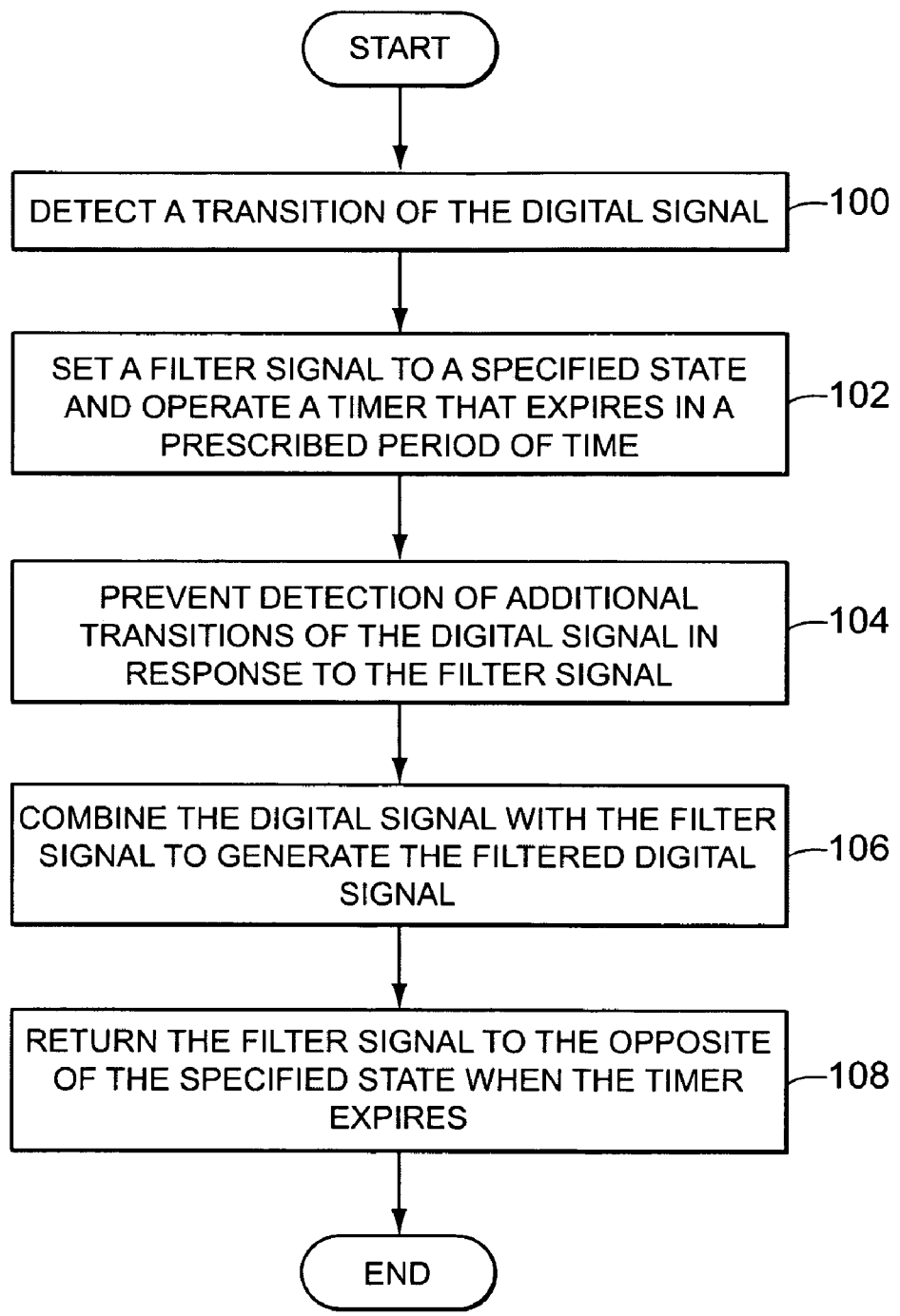
FIG. 6 show a flow chart describing a method for filtering in accordance with the present invention.

FIG. 6 shows a flow chart describing a method for filtering in accordance with the present invention. In step 100, a transition of the input digital signal is detected. In step 102, a filter signal is set to a specified state and a timer is set into operation, the timer expiring in a prescribed period of time. In step 104, detection of additional transitions of the digital signal is prevented in response to the filter signal. In step 106, the digital signal is combined with the filter signal to generate the filtered digital signal as the output signal. In step 108, the filter signal is returned to the opposite of the specified state when the timer expires.

Although the present invention has been described in considerable detail with reference to certain preferred versions thereof, other versions are possible. Therefore, the spirit and scope of the appended claims should not be limited to the description of the preferred versions contained herein.

What is claimed is:

1. A system for filtering spurious transitions from a digital signal, comprising:

a latch operative to follow on its output the digital signal in a follow mode and to hold the digital signal in the hold mode, the follow mode being responsive to a filter signal in a first state and the hold mode being responsive to the filter signal in a second state;

a timer connected to the output of the latch, for setting, upon a transition of the digital signal at the latch output, the filter signal in the second state and for setting the filter signal in the first state when the timer expires; and a logic circuit for combining the digital signal with the filter signal to generate the filtered digital signal, wherein the spurious logic transitions of the digital signal are blocked when the filter signal is in the second state.

2. The system for filtering as recited in claim 1, wherein the timer includes:

an integrator that generates, upon a transition of the digital signal at the latch output, a ramp waveform; and a comparator that sets, upon a transition of the digital signal at the latch output, the filter signal in the second state, and that sets the filter signal in the first state when the ramp waveform exceeds a threshold voltage.

3. The system for filtering, as recited in claim 2, wherein the integrator includes:

a capacitor connected between the output of the latch and the comparator input; and a current source that sources current to the comparator input.

4. The system for filtering, as recited in claim 3, wherein the current source includes:

a reference current source for providing a reference current; and a current mirror circuit having an input connected to receive the reference current and an output that provides the current to the comparator input.

5. The system for filtering, as recited in claim 3, wherein the current source includes:

a reference current source for providing a reference current;

a first transistor having a gate, a drain and a source, wherein the drain is connected to a reference current source and the source is connected to a supply voltage, and a second transistor having a gate, a drain and a source, wherein the drain is connected to the comparator input, the source is connected to the supply voltage and the gates of the first and second transistors are connected, such that the current provided to the comparator input by the second transistor is proportional to the reference current.

6. The system for filtering, as recited in claim 3, wherein the integrator includes an enable input for turning the current source on and off.

7. The system for filtering, as recited in claim 1, wherein the logic circuit is an OR-gate.

* * * * *